United States Patent
Nagaluru et al.

(10) Patent No.: US 11,440,535 B1
(45) Date of Patent: Sep. 13, 2022

(54) DIAGNOSTIC SYSTEM FOR A HYBRID ELECTRIC VEHICLE

(71) Applicant: LG Chem, Ltd., Seoul (KR)

(72) Inventors: Sagar Nagaluru, Warren, MI (US);
Sandeep Vankineni, Warren, MI (US);
Nitin Bharane, Warren, MI (US)

(73) Assignee: LG Energy Solution, Ltd., Seoul (KR)

( * ) Notice: Subject to any disclaimer, the term of this patent is extended or adjusted under 35 U.S.C. 154(b) by 64 days.

(21) Appl. No.: 17/203,853

(22) Filed: Mar. 17, 2021

(51) Int. Cl.
*B60W 20/00* (2016.01)
*B60W 20/50* (2016.01)
*B60W 10/24* (2006.01)
*B60W 50/02* (2012.01)
*H03K 19/20* (2006.01)

(52) U.S. Cl.
CPC ............ *B60W 20/50* (2013.01); *B60W 10/24* (2013.01); *B60W 50/0205* (2013.01); *H03K 19/20* (2013.01)

(58) Field of Classification Search
CPC .. B60W 20/50; B60W 10/24; B60W 50/0205; H03K 19/20
See application file for complete search history.

(56) References Cited

U.S. PATENT DOCUMENTS 4,964,506 A * 10/1990 Benford .............. F16H 63/3026
192/106 F
10,855,072 B2 12/2020 Chen et al.

FOREIGN PATENT DOCUMENTS

KR 1019980056735 A 9/1998
KR 101360820 B1 2/2014

* cited by examiner

*Primary Examiner* — Ian Jen
(74) *Attorney, Agent, or Firm* — Buckert Patent & Trademark Law Firm PC; John F. Buckert

(57) ABSTRACT

A diagnostic system for a hybrid electric vehicle is provided. The system includes a vehicle controller, a battery management controller, a monitoring circuit, a transistor, a voltage sensor, and an analog-to-digital converter. The vehicle controller sends a first message to the battery management controller indicating an engine crank occurred. The battery management controller sends a second message to the monitoring circuit, and the monitoring circuit induces a transistor to de-energize an electrical relay. The voltage sensor outputs a voltage signal indicative of a voltage being output by the transistor. The analog-to-digital converter outputs a voltage value indicative of the voltage. The battery management controller sets a diagnostic flag to a first non-fault value if the voltage value is less than a threshold voltage value.

10 Claims, 4 Drawing Sheets

DIAGNOSTIC SYSTEM FOR A HYBRID ELECTRIC VEHICLE

BACKGROUND

A diagnostic system for verifying a fail safe control path to a control relay in an hybrid electric vehicle is vulnerable to varying vehicle operational conditions (e.g., a battery voltage drop during engine crank) which can cause false diagnostic alarms. Further, a vehicle controller may undesirably disable the primary function of a hybrid electric vehicle in response to the false diagnostic alarms. A fail safe control path includes components and electrical lines that are utilized to detect a fault condition in the hybrid electric vehicle.

The inventors herein have recognized a need for an improved diagnostic system that eliminates the above-identified problem.

SUMMARY

A diagnostic system for a hybrid electric vehicle in accordance with an exemplary embodiment is provided. The diagnostic system includes a vehicle controller that is operably coupled to a battery management controller. The battery management controller is operably coupled to a monitoring circuit. The vehicle controller sends a first message to the battery management controller indicating an engine crank occurred. The battery management controller sends a second message to the monitoring circuit in response to the first message. The second message indicates that a diagnostic test is to be initiated. The monitoring circuit outputs a first signal which induces a transistor to turn off which de-energizes a voltage coil of an electrical relay in response to the second message to initiate the diagnostic test. The diagnostic system further includes a voltage sensor that outputs a voltage signal indicative of a voltage being output by the transistor to the voltage coil. The analog-to-digital converter receives the voltage signal and outputs a voltage value based on the voltage signal. The battery management controller receives the voltage value and sets a diagnostic flag to a first value if the voltage value is less than a threshold voltage value. The first value indicates that the diagnostic system is operating as desired to detect a fault condition.

DETAILED DESCRIPTION

Figure 1:
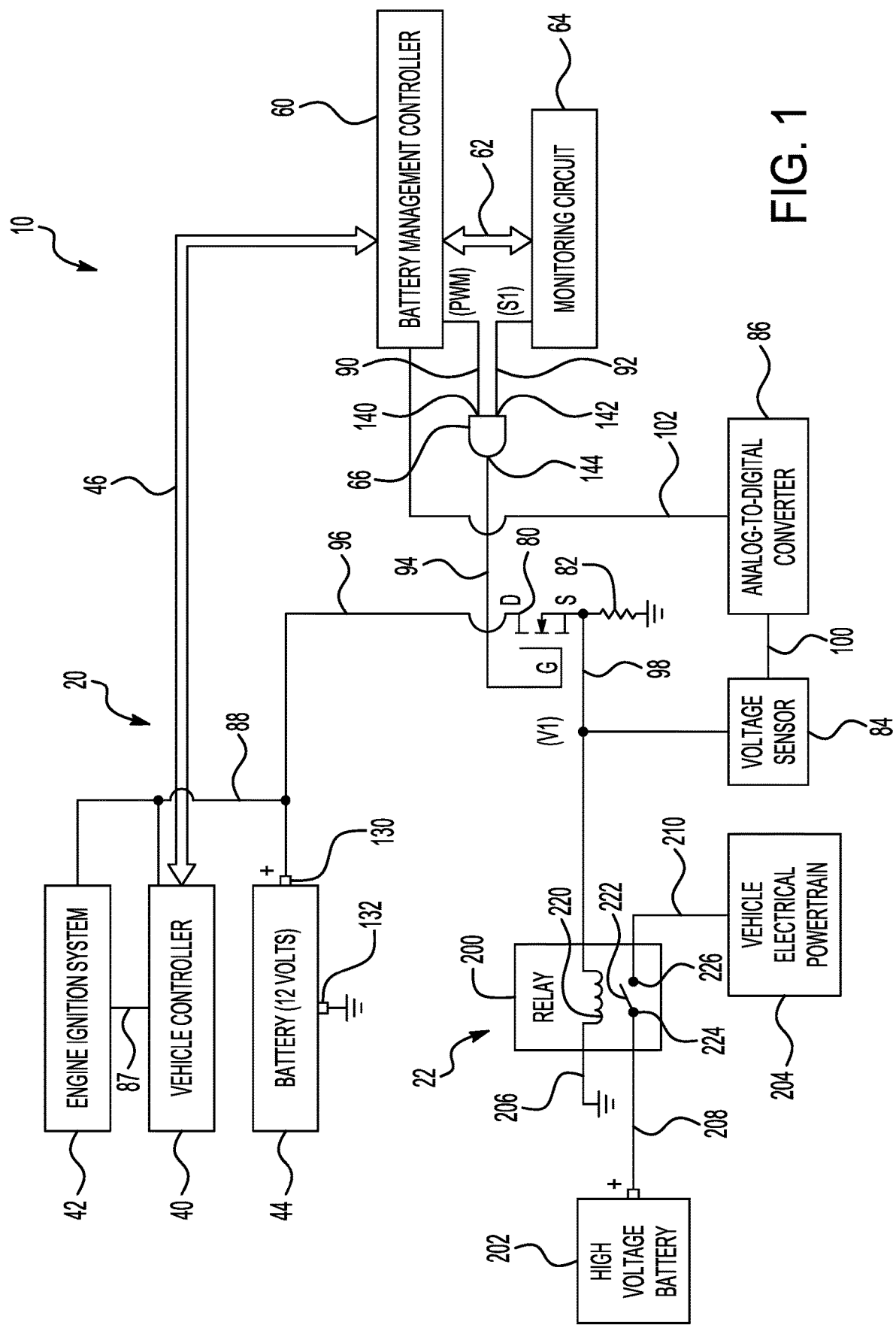
FIG. 1 is a schematic of a hybrid electric vehicle having a diagnostic system and a high voltage electrical system.

Referring to FIG. 1, a hybrid electric vehicle 10 having a diagnostic system 20 in accordance with an exemplary embodiment, and a high voltage electrical system 22 are illustrated.

The diagnostic system 20 is provided to simulate a fault condition in the transistor 80 and then to determine whether the diagnostic system 20 properly detects the fault condition. The diagnostic system 20 includes a vehicle controller 40, an engine ignition system 42, a battery 44, a communication bus 46, a battery management controller 60, a communication bus 62, a monitoring circuit 64, an AND logic gate 66, the transistor 80, a resistor 82, a voltage sensor 84, an analog-to-digital converter 86, and electrical lines 87, 88, 90, 92, 94, 96, 98, 100, 102.

The engine ignition system 42 is provided to start an engine (not shown). The engine ignition system 24 is electrically coupled to the battery 44 via the electrical line 88.

The vehicle controller 40 is provided to monitor the engine ignition system 42 and to communicate with the battery management controller 60 via the communication bus 46. The vehicle controller 40 is electrically coupled to the engine ignition system 42 via the electrical line 87. Further, the vehicle controller 40 is electrically coupled to the battery 44 via the electrical line 88 and receives an operational voltage from the battery 44. During operation, the vehicle controller 40 sends a message to the battery management controller 60 indicating that an engine crank condition occurred within the engine ignition system 42. An engine crank condition occurs when an engine in the hybrid electric vehicle 10 is being started utilizing the battery 44.

Figure 2:
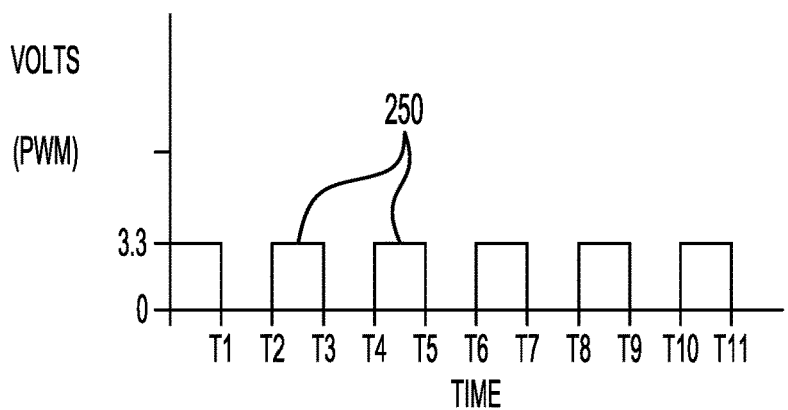
FIG. 2 is a signal schematic illustrating a pulse width modulated (PWM) signal generated by a battery management controller in the diagnostic system of FIG. 1.

The battery management controller 60 is provided to send a message to the monitoring circuit 64 to initiate a diagnostic test after the battery management controller 60 receives the message indicating an engine crank condition occurred from the vehicle controller 40. The battery management controller 60 operably communicates with the monitoring circuit 64 via the communication bus 62, and operably communicates with vehicle controller 40 via the communication bus 46. The battery management controller 60 is electrically coupled to a first input terminal 140 of the AND logic gate 66 utilizing the electrical line 90. Further, the battery management controller 60 is electrically coupled to the analog-to-digital converter 86 via the electrical line 102. The battery management controller 60 is further provided to output a pulse width modulated signal (PWM shown in FIG. 2) which is received at the first input terminal 140 of the AND logic gate 66. Also, the battery management controller 60 is provided to receive a voltage value from the analog-to-digital converter 86. In an exemplary embodiment, the battery management controller 60 includes a microprocessor (not shown).

Figure 3:
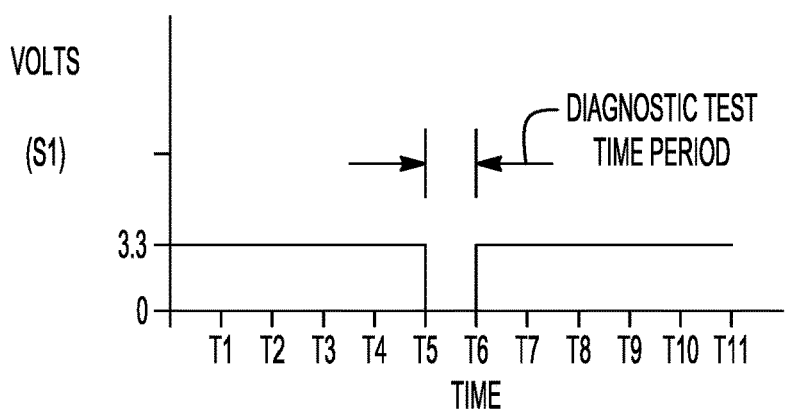
FIG. 3 is a signal schematic illustrating a signal (S1) generated by a monitoring circuit in the diagnostic system of FIG. 1.

The monitoring circuit 64 is provided to output a low logic level signal (signal S1 from time interval T5-T6 in FIG. 3) to a second input terminal 142 of the AND logic gate 66 via the electrical line 92 in response to the message indicating the crank condition, to initiate a diagnostic test. In particular, the low logic level signal is used to force the AND logic gate 66 to turn off the transistor 80 which simulates a fault condition. The monitoring circuit 64 is electrically coupled to the second input terminal 142 of the AND logic gate 66 via the electrical line 92. The monitoring circuit 64 further operably communicates with the battery management controller 60 via the communication bus 62. In an exemplary embodiment, the monitoring circuit 64 includes a microprocessor (not shown).

The AND logic gate 66 is provided to control the operation of the transistor 80. In particular, the AND logic gate 66 receives the pulse width modulated signal (PWM) from the battery management controller 60 and the signal (S1) from the monitoring circuit 64. When either of the PWM and S1 signals have a low logic level, the AND logic gate 66 outputs a voltage at an output terminal 144 thereof having a low logic level. Alternately, when both of the PWM and S1 signals have a high logic level, the AND logic gate 66 outputs a voltage having a high logic level. The AND logic gate 66 includes first and second input terminals 140, 142 and output terminal 144. The first input terminal 140 is electrically coupled to the battery management controller 60 utilizing the electrical line 90. The second input terminal 142 that is electrically coupled to the monitoring circuit 64 utilizing the electrical line 92. The output terminal 144 is electrically coupled to a gate terminal G of the transistor 80. During a diagnostic test, the AND logic gate 66 outputs a low logic level signal which should induce the transistor 80 to turn off to de-energize a voltage coil 220 of an electrical relay 200.

The transistor 80 is utilized to control the operation of the electrical relay 20. In an exemplary embodiment, the transistor 80 is a MOSFET and includes a gate terminal G, a drain terminal D, and a source terminal S. The gate terminal G is electrically coupled to the output terminal 144 of the AND logic gate 66. The source terminal S is electrically coupled to the resistor 82 which is further electrically coupled to electrical ground. The drain terminal D is electrically coupled to the battery 44 utilizing the electrical line 96.

When the transistor 80 receives a high logic level signal at the gate terminal G, the transistor 80 turns on which energizes the voltage coil 220 of the electrical relay 200 to transition the relay contact 22 to a closed operational state. Alternately, when the transistor 80 receives a high logic level signal at the gate terminal G, the transistor 80 turns off which de-energizes the voltage coil 220 of the electrical relay 200 to transition the relay contact 22 to an open operational state.

The voltage sensor 84 is provided to monitor a voltage V1 being output by the transistor 80. In particular, the voltage sensor 84 outputs a voltage signal indicative of the voltage V1 being output by the transistor 80 to the voltage coil 220 of the electrical relay 200. The voltage sensor 84 is electrically coupled to the electrical line 98 which is further electrically coupled to the source S of the transistor 80. The voltage sensor 84 is further electrically coupled to the analog-to-digital converter 86 via the electrical line 100.

Figure 4:
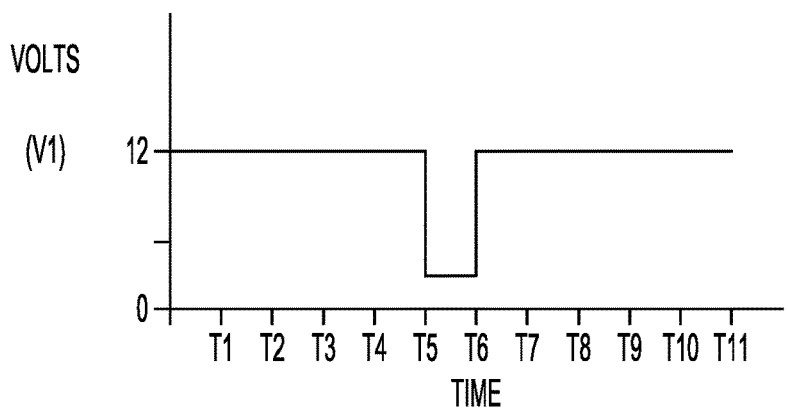
FIG. 4 is a signal schematic of a voltage being output by a transistor in the diagnostic system of FIG. 1 indicating that the diagnostic system is operating as desired.
Figure 5:
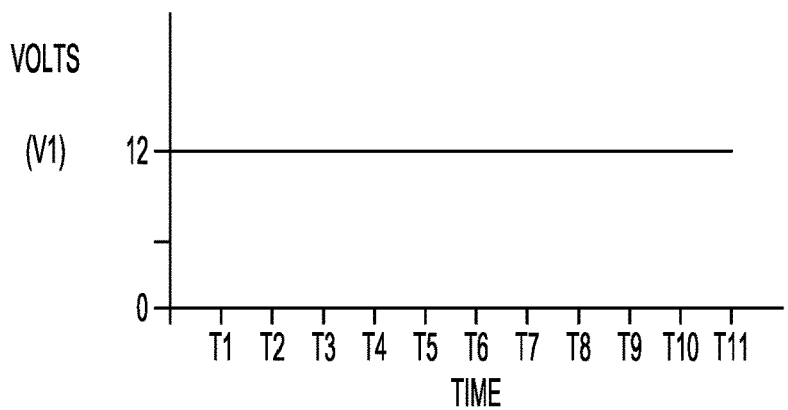
FIG. 5 is a signal schematic of a voltage being output by a transistor in the diagnostic system of FIG. 1 indicating that the diagnostic system is not operating as desired.

The analog-to-digital converter 86 is provided to receive the voltage signal from the voltage sensor 84 and to output a voltage value based on the voltage signal that is received by the battery management controller 60. The analog-to-digital converter 86 is electrically coupled to the voltage sensor 84 utilizing the electrical line 100. Further, the analog-to-digital converter 86 is electrically coupled to the battery management controller 60 utilizing the electrical line 102. When the battery management controller 60 receives the voltage value from the analog-to-digital converter 86 (e.g., proportional to V1 during times T5-T6 in FIG. 4) that is less than a threshold voltage value, the controller 60 sets a diagnostic flag to a first value indicating the diagnostic system 20 is operating as desired to detect a fault condition. Alternately, when the battery management controller 60 receives the voltage value from the analog-to-digital converter 86 (e.g., proportional to V1 during times T5-T6 in FIG. 4) that is greater than or equal to the threshold voltage value, the controller 60 sets a diagnostic flag to a second value indicating the diagnostic system 20 is not operating as desired and is unable to detect a fault condition.

The high voltage electrical system 22 is utilized to provide propulsion power for the hybrid electric vehicle 10. The high voltage electrical system includes an electrical relay 200, a high voltage battery 202, and a vehicle electrical powertrain 204. The electrical relay 200 includes a voltage coil 220, a relay contact 222, a first node 224, and a second node 226. The voltage coil 220 is electrically coupled to the transistor 80 utilizing the electrical line 98. The voltage coil 220 is further electrically coupled to electrical ground utilizing the electrical line 206. The first node 224 is electrically coupled to a positive terminal of the high voltage battery 202. The second node 226 is electrically coupled to the vehicle electrical powertrain 204 utilizing the electrical line 210. When the AND logic gate 80 outputs a high logic level voltage, the voltage coil 220 is energized which transitions the relay contact 222 to a closed operational state such that the first node 224 is electrically coupled to the second node 226, and the high voltage battery 202 is electrically coupled to the vehicle electrical powertrain 204. Alternately, when the AND logic gate 80 outputs a low logic level voltage, the voltage coil 220 is de-energized which transitions the relay contact 222 to an open operational state such that the first node 224 is electrically de-coupled to the second node 226, and the high voltage battery 202 is electrically de-coupled to the vehicle electrical powertrain 204.

Figure 6:
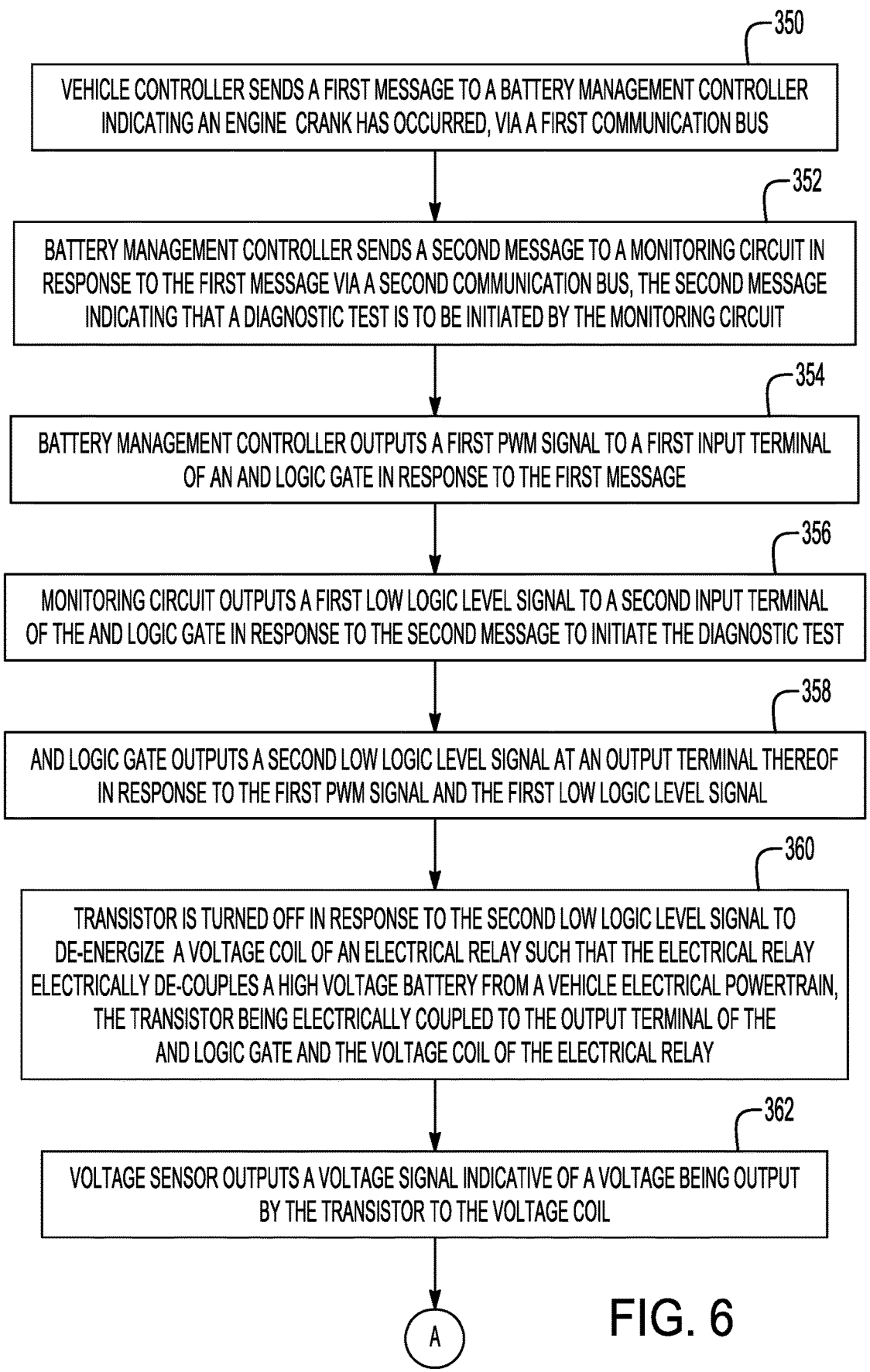
FIGS. 6 and 7 are flowcharts of a method for performing a diagnostic test utilizing the diagnostic system of FIG. 1.
Figure 7:
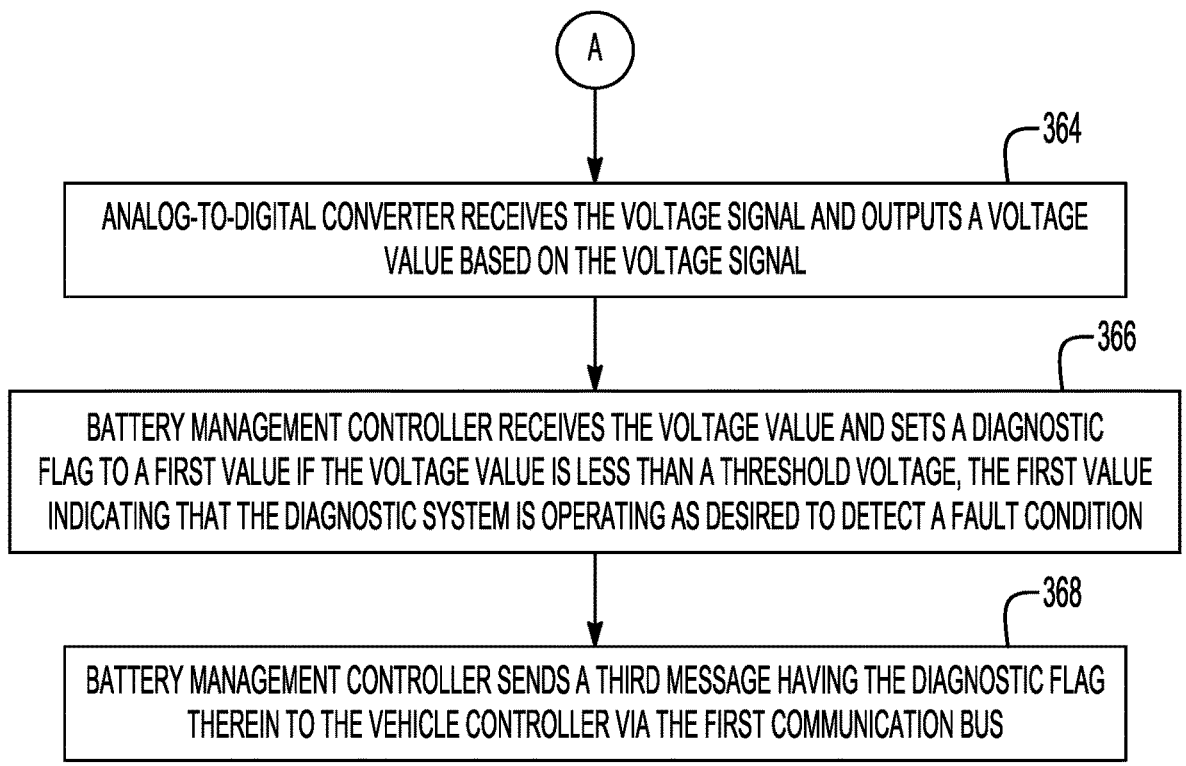

Referring to FIGS. 1, 6 and 7, a flowchart of a method for performing a diagnostic test utilizing the diagnostic system 20 will now be explained.

At step 350, the vehicle controller 40 sends a first message to a battery management controller 60 indicating an engine crank has occurred, via a first communication bus 46. After step 350, the method advances to step 352.

At step 352, the battery management controller 60 sends a second message to a monitoring circuit 64 in response to the first message via a second communication bus 62. The second message indicates that a diagnostic test is to be initiated by the monitoring circuit 64. After step 352, the method advances to step 354.

At step 354, the battery management controller 60 outputs a first PWM signal to a first input terminal 140 of an AND logic gate 66 in response to the first message. After step 354, the method advances to step 356.

At step 356, the monitoring circuit 64 outputs a first low logic level signal to a second input terminal 142 of the AND logic gate 66 in response to the second message to initiate the diagnostic test. After step 356, the method advances to step 358.

At step 358, the AND logic gate 66 outputs a second low logic level signal at an output terminal 144 thereof in response to the first PWM signal and the first low logic level signal. After step 358, the method advances to step 360.

At step 360, the transistor 80 is turned off in response to the second low logic level signal to de-energize a voltage coil 220 of an electrical relay 200 such that the electrical relay 200 electrically de-couples a high voltage battery 202 from a vehicle electrical powertrain 204. The transistor 80 is electrically coupled to the output terminal 144 of the AND logic gate 66 and the voltage coil 220 of the electrical relay 200. After step 360, the method advances to step 362.

At step 362, the voltage sensor 84 outputs a voltage signal indicative of a voltage being output by the transistor 80 to the voltage coil 220. After step 362, the method advances to step 364.

At step 364, the analog-to-digital converter 86 receives the voltage signal and outputs a voltage value based on the voltage signal. After step 364, the method advances to step 366.

At step 366, the battery management controller 60 receives the voltage value and sets a diagnostic flag to a first value if the voltage value is less than a threshold voltage value. The first value indicates that the diagnostic system 20 is operating as desired to detect a fault condition. After step 366, the method advances to step 368.

At step 368, the battery management controller 60 sends a third message having the diagnostic flag therein to the vehicle controller 40 via the first communication bus 46.

The diagnostic system 20 provides a substantial advantage over other systems. In particular, the diagnostic system 20 only performs a diagnostic test after an engine crank condition has occurred. As a result, the voltage of the battery 44 has stabilized after the engine crank condition and thus any voltage values measured by the voltage sensor 84 are accurate. As a result, the diagnostic system 20 can perform a diagnostic test to accurately determine whether a fail safe control path in the diagnostic system is operating as desired to detect a fault condition.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A diagnostic system for a hybrid electric vehicle, comprising:
   a vehicle controller being operably coupled to a battery management controller; the battery management controller being operably coupled to a monitoring circuit;
   the vehicle controller sending a first message to the battery management controller indicating an engine crank occurred;
   the battery management controller sending a second message to the monitoring circuit in response to the first message, the second message indicating that a diagnostic test is to be initiated;
   the monitoring circuit outputting a first signal which induces a transistor to turn off which de-energizes a voltage coil of an electrical relay in response to the second message to initiate the diagnostic test;
   a voltage sensor outputting a voltage signal indicative of a voltage being output by the transistor to the voltage coil;
   the analog-to-digital converter receiving the voltage signal and outputting a voltage value based on the voltage signal; and
   the battery management controller receiving the voltage value and setting a diagnostic flag to a first value if the voltage value is less than a threshold voltage value, the first value indicating that the diagnostic system is operating as desired to detect a fault condition.

2. The diagnostic system of claim 1, further comprising:
the battery management controller outputting a first PWM signal to a first input terminal of an AND logic gate in response to the first message.

3. The diagnostic system of claim 2, wherein:
the first signal of the monitoring circuit being a first low logic level signal; and
the monitoring circuit outputting the first low logic level signal to a second input terminal of the AND logic gate in response to the second message, to initiate the diagnostic test.

4. The diagnostic system of claim 3, wherein:
the AND logic gate outputting a second low logic level signal in response to the first PWM signal and the first low logic level signal; and
the transistor being electrically coupled to an output terminal of the AND logic gate and the voltage coil of the electrical relay, the transistor being turned off in response to the second low logic level signal to de-energize the voltage coil of the electrical relay.

5. The diagnostic system of claim 1, wherein:
the voltage sensor being electrically coupled to and between an output terminal of the transistor and the analog-to-digital converter, the voltage sensor outputting the voltage signal indicative of the voltage being output by the transistor.

6. The diagnostic system of claim 1, wherein:
the vehicle controller being operably coupled to the battery management controller via a first communication bus.

7. The diagnostic system of claim 6, wherein:
the battery management controller being operably coupled to the monitoring circuit via a second communication bus.

8. The diagnostic system of claim 1, wherein:
the battery management controller sending a third message having the diagnostic flag therein to the vehicle controller.

9. The diagnostic system of claim 1, wherein:
the transistor being a MOSFET.

10. The diagnostic system of claim 1, wherein:
when the voltage coil of the electrical relay is de-energized, the electrical relay electrically de-couples a high voltage battery from a vehicle electrical powertrain.

\* \* \* \* \*